June 1, 1954 G. T. ROYDEN 2,680,197

CRYSTAL CONTROLLED OSCILLATOR

Filed May 15, 1951 2 Sheets-Sheet 1

INVENTOR.
GEORGE T. ROYDEN.
BY Philip M. Bolton
ATTORNEY.

June 1, 1954

G. T. ROYDEN 2,680,197

CRYSTAL CONTROLLED OSCILLATOR

Filed May 15, 1951

2 Sheets-Sheet 2

INVENTOR.
GEORGE T. ROYDEN.
BY Philip M. Bolton
ATTORNEY

Patented June 1, 1954

2,680,197

UNITED STATES PATENT OFFICE 2,680,197

CRYSTAL CONTROLLED OSCILLATOR

George T. Royden, South Orange, N. J., assignor to Mackay Radio and Telegraph Company, New York, N. Y., a corporation of Delaware Application May 15, 1951, Serial No. 226,446

18 Claims. (Cl. 250—36)

This invention relates to oscillation generators and particularly to a vacuum tube type of oscillation generator having both amplitude and frequency stabilization devices.

A vacuum tube oscillation generator or oscillator will be relatively unstable and its output voltage will include harmonics of the fundamental operating frequency unless special care is taken to operate the tube at the proper point on its characteristic and to control the feedback between the input and output circuits of the oscillator. The operation of an oscillator may therefore be improved by automatically regulating the amplitude of the feedback voltage.

A further improvement in the frequency stability of an oscillator may be obtained, as is well known, by the use of a piezoelectric crystal as the frequency determining element of an oscillator. Such crystals may, for example, be formed and be connected in an oscillator so as to act in the same manner as a stable, high Q, series resonant circuit.

It has heretofore been known to stabilize and improve the form of the output voltage of a vacuum tube oscillator by the use of both a non-linear impedance such as a current variable resistance and a piezoelectric crystal. However, in known types of oscillators using such devices, reactive elements also have been employed as part of the frequency determining circuit and transformers have been employed for isolation or matching purposes or to produce the polarities or phase shifts necessary for oscillation. These reactive elements including the transformers, affect the frequency of oscillation and hence prevent obtaining maximum stability and may also produce spurious or undesired oscillations. Furthermore, inductance devices are relatively expensive as compared to simple resistors or condensers of small value.

In addition, when the current variable resistance and the crystal are parts of a common network, it is not possible to adjust readily the automatic control of the amplitude of the oscillations independently of the frequency of oscillations and independently of the impedance of the crystal, and it may, therefore, be desirable to include the current variable resistance in a separate network coupled to the network including the crystal by a vacuum tube amplifier. With this arrangement it is also desirable to eliminate the use of reactances such as transformers, etc.

Accordingly, it is the object of my invention to provide a stabilized oscillator which is simple in construction and economical to manufacture. It is a further object of my invention to provide a stabilized oscillator which may be readily adjusted without undesirable interaction between the circuits being adjusted.

Other objects and advantages of my invention will be apparent from the description of the specific embodiments of the invention, given hereinafter by way of example only, and setting forth the manner in which I now prefer to practice the invention.

In accordance with one embodiment of my invention, the oscillation generator or oscillator comprises an amplifier having an input and an output and a feedback circuit including a pair of series connected bridge networks interconnecting the input and the output of the amplifier. One of the bridge networks includes a frequency determining impedance in one arm and the other of the bridge networks includes a non-linear impedance in one arm.

The preferred embodiment of my invention includes a pair of vacuum type amplifiers interconnected by a pair of bridge networks, one of the networks including a piezoelectric crystal in one arm thereof and the other of the networks including a current variable resistance in one arm thereof. The output of one amplifier and the input of the other amplifier are connected to conjugate points on one of the bridge networks, and the output of the other amplifier and the input of the one amplifier are connected to conjugate points on the other bridge network. In the preferred embodiment of the invention, none of the arms of the bridge networks includes an inductive impedance, but instead all of the arms, except the balancing arm of the frequency determining bridge network, include only resistors. This balancing arm may include a condenser in shunt with a resistor for balancing the capacitive reactances and the resistance of the crystal and its holder. Alternatively, the balancing arm may include only a resistor and the capacitive reactances of the crystal and its holder may be compensated by connecting an inductance in series with a blocking condenser and by connecting them in shunt with the crystal and its holder.

My invention may be better understood by referring to the following detailed description of the invention and to the accompanying drawings in which.

Figure 1:
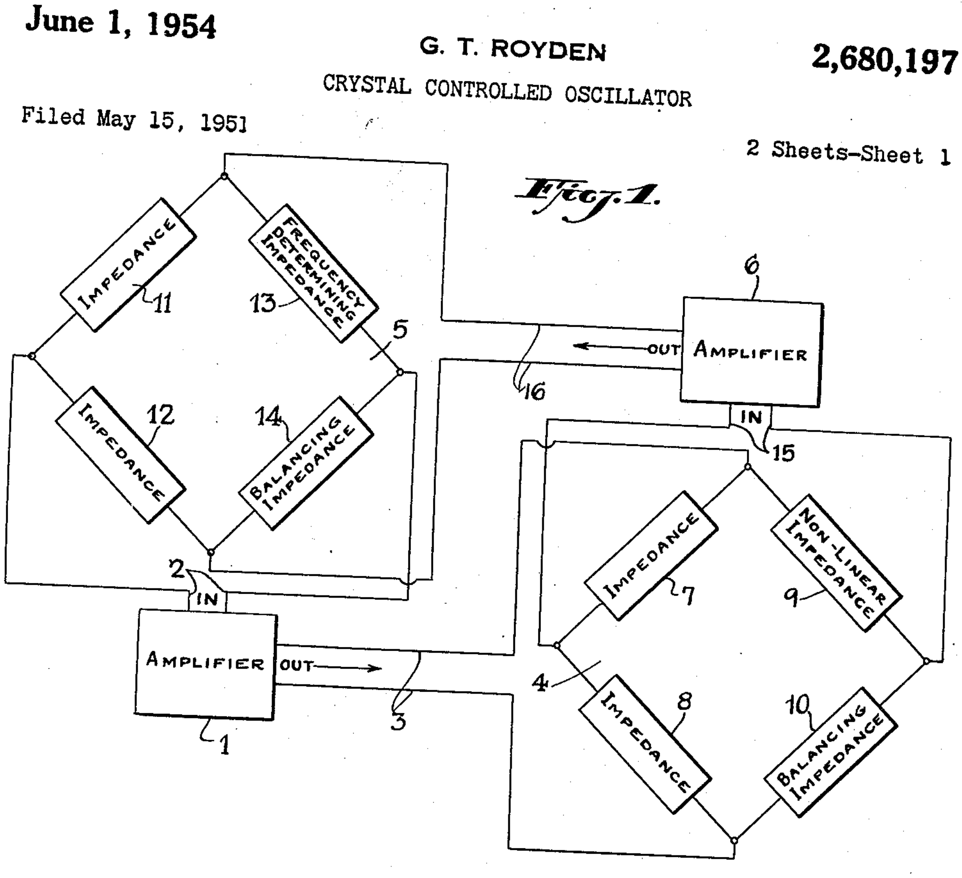
Fig. 1 is a block diagram illustrating generally the arrangement of the elements of the oscillation generator of my invention.

The oscillation generator illustrated in Fig. 1 comprises an amplifier 1 having an input 2 and an output 3. The input of amplifier 1 is interconnected with its output by a feedback circuit comprising a pair of bridge networks designated generally by the numerals 4 and 5 and an amplifier 6. The amplitude determining bridge network 4 has four series connected arms including impedances 7 and 8, a non-linear impedance 9 and a balancing impedance 10. The frequency determining bridge network 5 has four series connected arms including the impedances 11 and 12, a frequency determining impedance 13 and a balancing impedance 14. The amplifier 6 has an input 15 and an output 16.

The output 3 of the amplifier 1 and the input 15 of the amplifier 6 are connected to conjugate points on the bridge network 4 and the output 16 of the amplifier 6 and the input 2 of the amplifier 1 are connected to conjugate points on the bridge network 5. These conjugate points on the bridge networks 4 and 5 may be the diagonally opposite junction points between the arms of the bridges, as indicated in Fig. 1, but they may also be other points on the bridge networks which are so related that when each bridge is slightly unbalanced, i. e., approximately but not exactly balanced, the voltages thereby produced are such that their sum equals the sum of the voltage gains in the two amplifiers minus the other losses. Also, each bridge network should be unbalanced in the direction which produces a voltage at one pair of conjugate points substantially in phase with the voltage at the other pair of conjugate points.

The non-linear impedance 9 in the bridge network 4 may be an impedance whose value increases with an increase of current passing through the impedance or the voltage across the terminals of the impedance. Such an impedance may, for example, be a resistance whose temperature changes with the current flowing therethrough and whose value of resistance increases with temperature, a lamp whose filament increases its resistance with increases of current passing through the filament being an example of a resistance of this type. The balancing impedance 10 is preferably an impedance which has both the value of resistance and reactance necessary in combination with the values of the impedances 7, 8 and 9 to substantially balance the bridge network 4 at some amplitude of voltage higher than that desired during the operation of the oscillation generator. If, for example, the impedances 7 and 8 are resistors, the balancing impedance 10 may, in most cases, be merely a third resistor, but if the capacitive reactance of the non-linear impedance 9 is not negligible, the balancing impedance 10 may also include a condenser connected in parallel with a resistor.

If a non-linear impedance whose value decreases with increases of current is employed in the bridge network 4, then the impedances 9 and 10 should be interchanged so as to produce an unbalance in the proper direction as explained above.

The frequency determining impedance 13 in the bridge network 5 may be a resonant impedance, such as a piezoelectric crystal. In the preferred form of the invention, the frequency determining impedance is a crystal constructed to operate in its series resonant mode at the frequency of operation of the oscillation generator. The balancing impedance 14 in the bridge network 5 includes the circuit components necessary with the impedances 11, 12 and 13, to substantially balance the bridge network 5 in phase and to approximately balance network 5 in amplitude at the frequency of operation of the oscillation generator. When a piezoelectric crystal operating at series resonance is employed as the frequency determining impedance 13, this impedance will have both a resistive and a capacitive component at the frequency of operation of the oscillation generator, and, therefore, the balancing impedance 14 would comprise a resistor connected in parallel with a condenser. However, the balancing impedance 14 may also include other circuit components, if necessary, to produce approximately a bridge balance at the frequency of operation. Preferably, also, the impedances 11 and 12 are resistors.

When the generator illustrated in Fig. 1 is first put into operation, both of the networks 4 and 5 will be unbalanced and the amplitude of the oscillations will increase until the net gain in the amplifier and feedback circuit is approximately equal to unity. Under these conditions, both networks 4 and 5 will each be slightly unbalanced, i. e., approximately but not exactly balanced, and the frequency of the oscillations will be determined primarily by the frequency determining impedance in the network 5 and the amplitude of the oscillations will be determined primarily by the network 4. It will be noted that it is relatively simple to adjust either the frequency of oscillation or amplitude of the oscillations by adjusting the networks 5 and 4, respectively. Furthermore, the value of the non-linear impedance is independent of the resonant frequency impedance of the impedance 13 and vice versa, and, therefore, the impedance values of these two impedances may be selected for best operation. In addition, with the non-linear impedance 9 in a separate bridge network as shown, and with resistors in the remaining arms 7, 8 and 10 of the network 4, the variations of the value of the impedance 9 have substantially no effect on the frequency of oscillation. This is due to the fact that variations in the value of the non-linear impedance 9 affect only the amplitude of the output of the network 4 and not the phase of the output.

It should be noted in connection with the arrangement described above and in connection with the circuits to be described hereinafter that the impedances in the opposite arms of the bridge networks may be interchanged. Thus, for example, impedance 13 may be interchanged with impedance 12, impedance 14 with impedance 11, impedance 10 with impedance 7 or impedance 9 with impedance 8, and only one pair or all pairs of opposite arms may be interchanged in any particular embodiment of the invention.

Figure 2:
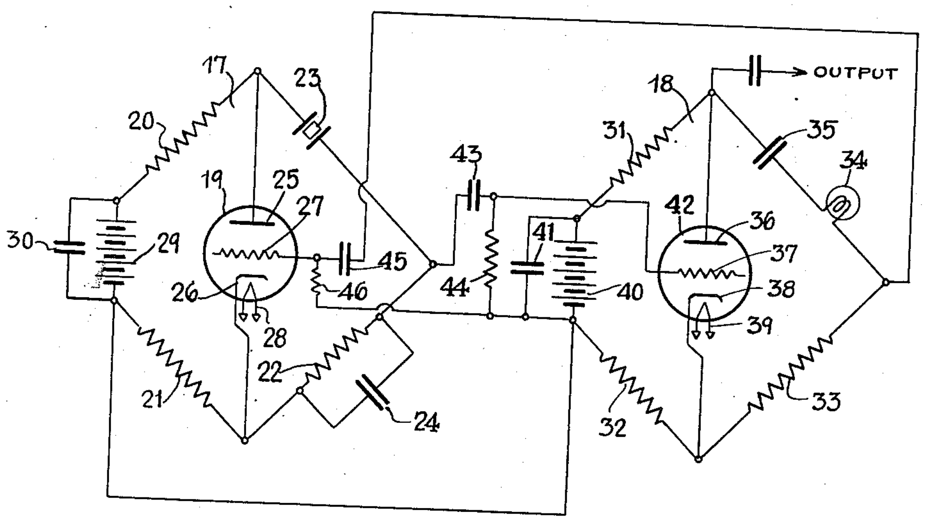
Fig. 2 is an electrical circuit diagram illustrating the preferred embodiment of the oscillation generator of my invention.

Referring now to Fig. 2 which shows a preferred embodiment of my invention, it will be seen that the oscillation generator comprises two bridge networks designated generally by the numerals 17 and 18 and a pair of amplifiers comprising the vacuum tubes 19 and 42. The frequency determining bridge network 17 comprises three series connected resistors 20, 21 and 22 and a piezoelectric crystal 23. The resistor 22 with a condenser 24 form a balancing impedance which together with the resistors 20 and 21 and the crystal 23 approximately but not exactly balance the network 17 at the frequency of operation. The values of the resistors 20, 21 and 22 and the condenser 24 may be determined by the following equations:

$$R_5 \times R_1 = K_1 \times R_2 \times R_e$$

and $$C_1 \times R_2 = C_e \times R_1$$

where $R_5$ represents the value of the resistor 22,
$R_1$ represents the value of the resistor 20,
$R_2$ represents the value of the resistor 21.
$R_e$ represents the value of the equivalent resistance of the crystal 23 when operated at series resonance,
$C_1$ represents the value of the condenser 24,
$C_e$ represents the value of the equivalent shunt capacitance of crystal 23 and its holder, and
$K_1$ represents the amount of unbalance necessary to maintain oscillation and has a value slightly smaller than unity.

The vacuum tube 19 comprises an anode 25 connected to the junction point between the arms including the resistor 20 and the crystal 23, a cathode 26 connected to the junction point between the arms including the resistors 21 and 22, a control electrode or grid 27 connected by a coupling condenser 45 to a junction point between a pair of arms of the other network 18 and a heater 28. A grid leak resistor 46, connected between the grid 27 and the negative terminal of a source of energizing potential 29, maintains the grid 27 at proper bias potential. The anode 25 and the cathode 26 may be considered as the output electrodes of the vacuum tube 19.

The source of energizing potential 29 by-passed by a condenser 30, is connected in series with the resistors 20 and 21 and the tube 19 and may be connected intermediate the resistors 20 and 21 as shown.

In their practical form, crystals usually have more than one resonant frequency, but by proper design one of these resonant frequencies may predominate over the others and the equivalent series resistance for the predominant frequency will be lower than that for the other unwanted frequencies. This characteristic permits the other three arms, 20, 21, and 22, to be chosen so the phase of the potential at the junction of the crystal 23 and resistor 22 will be 180 degrees out of phase with respect to the potential applied to grid 27 for the predominant frequency. For the other undesired modes of vibration, the higher equivalent series resistance of the crystal would cause the bridge to be unbalanced in an opposite direction, and, therefore, oscillation cannot occur at such unwanted frequencies.

An unbalance for the resistive component of bridge network 17 is necessary to maintain oscillation, but it is desirable that this unbalance be small because the change of phase with variation of frequency becomes more rapid as the unbalance becomes smaller. The oscillator operates at the frequency at which the phase shift around the loop is zero. Therefore, the smaller the unbalance, the better the frequency stability.

The amplitude determining bridge network 18 comprises three series connected resistors 31, 32 and 33 forming three arms of the bridge and a lamp 34 whose resistance increases with increases of current therethrough in series with a blocking condenser 35 forming the fourth arm of the bridge. The blocking condenser 35 has a negligible impedance at the frequency of operation of the generator and serves merely to isolate the lamp 34 from the direct current potentials applied to the electrodes of the tube 42.

The vacuum tube 42 which may be a triode like tube 19 has an anode 36, a control electrode or grid 37, a cathode 38 and a heater 39. The tube 42 is energized by the source 40 by-passed by a condenser 41 and connected intermediate the resistors 31 and 32. The anode 36 is connected to the junction point between the arm including the resistor 31 and the arm including the condenser 35, and the cathode 38 is connected to the junction point between the arms including, respectively, the resistors 32 and 33. The grid 37 is connected by a condenser 43 to the junction point between the arms containing the crystal 23 and the resistor 22 of the bridge network 17. A resistor 44 is connected between the grid 37 and the negative terminal of the source 40, thereby maintaining the proper grid bias potential.

When the generator is in operation, the resistors 31, 32 and 33 and the lamp 34 have values determined by the following equation:

$$R_7 \times R_3 = K_2 \times R_b \times R_4$$

where $R_7$ represents the value of the resistor 33,
$R_3$ represents the value of the resistor 31,
$R_4$ represents the value of the resistor 32,
$R_b$ represents the resistance of the lamp filament, and
$K_2$ represents the amount of unbalance necessary to maintain the desired operating level and has a value slightly smaller than unity.

Since $R_b$ increases in value with an increase of current through the filament, $R_7$ times the ratio of $R_3$ to $R_4$ should be somewhat greater than the cold resistance of the filament.

The operation of the generator shown in Fig. 2 is the same as the operation of the generator described in connection with Fig. 1. During operation the voltage applied to the grid 27 is 180 degrees out of phase with respect to the voltage at the junction between the crystal 23 and the resistor 22, and the necessary phase shift is provided by the bridge networks 17 and 18 and the tube 42 without the use of transformers or other inductive reactances.

Energy may be taken from the oscillation generator at the junction between the resistor 31 and the condenser 35 of bridge network 18 as indicated. However, energy may also be taken from the generator at the cathodes 26 and 38 or at the junction between the resistor 20 and the crystal 23.

As mentioned above, the impedances in the various opposite arms in the bridge networks may be interchanged and if a non-linear impedance whose value decreases with increases of current is used in the amplitude determining bridge network, such a non-linear impedance should be included in a different arm of the bridge from the one shown in Figs. 1 and 2. Furthermore, it may be desirable in practice to eliminate one of the two sources of energizing potential 29 and 40 shown in Fig. 2. An embodiment illustrating such modifications is shown in Fig. 3.

Figure 3:
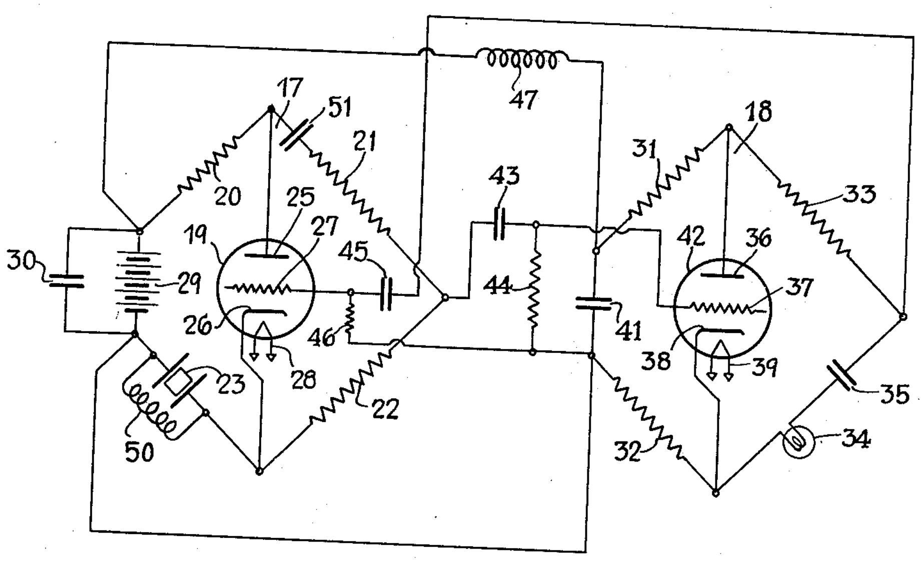
Fig. 3 is an electrical circuit diagram illustrating an alternative embodiment of the oscillation generator of my invention.

Referring to Fig. 3, it will be seen that the circuit is the same as the circuit shown in Fig. 2 except for the positions of the impedances 21, 23, 33, 34 and 35, the elimination of the source 40 and the condenser 24 and the addition of an isolating impedance 47 to interconnect the source 29 with the bridge network 18. Furthermore, the circuit in Fig. 3 differs from the circuit shown in Fig. 2 in that a balancing inductance 50 is connected in parallel with the crystal 23 and a blocking condenser 51 having a negligible reactance is connected in series with resistor 21. In this figure, the resistor 21 has been interchanged with the crystal 23, and since the non-linear impedance in the amplitude determining bridge network 18 is a lamp 34 whose resistance decreases with increases of current therethrough, the lamp 34 and its associated blocking condenser 35 have been interchanged with the resistor 33.

Also, in Fig. 3, the source 29 provides the energizing potentials for both tubes 19 and 42. The source 29 is connected to the junction point between the resistor 31 and the condenser 41 by an isolating impedance 47 in the form of an inductance which is of a sufficiently large value at the operating frequency of the oscillator to isolate the bridge network 18 from the bridge network 17 for all voltages of the operating frequency.

As mentioned above, the balancing condenser 24 may be omitted in the circuit shown in Fig. 3, but its function is performed by the inductance 50 which, in addition, provides a direct current path between the cathode 26 and the source 29. The inductance 50 is so chosen that its reactance is substantially equal to the capacitive reactances of the crystal 23 and its holder at the operating frequency, and, therefore, the bridge network 17 may be balanced with only resistors in the remaining arms of the network.

The operation of the embodiment of the oscillation generator shown in Fig. 3 is in principle the same as the operation of the embodiment of the oscillation generator shown in Fig. 2 and, therefore, its operation and adjustment will be understood by those skilled in the art by the reference to the description given above in connection with Fig. 2.

Figure 4:
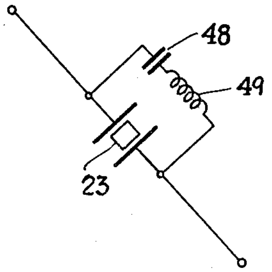
Fig. 4 illustrates an alternative circuit for one arm of the frequency determining bridge network shown in Fig. 2.

Fig. 4 illustrates an alternative circuit for the arm of the frequency determining bridge 17 of Fig. 2 which includes the crystal 23. The circuit includes a piezoelectric crystal 23 connected in shunt with the series connected blocking condenser 48 and inductance 49. The blocking condenser 48 has a negligible reactance at the operating frequency of the oscillation generator and the value of the inductance 49 is so chosen that its reactance is substantially equal to the capacitive reactances of the crystal 23 and its holder at the operating frequency. The circuit shown in Fig. 4 may be substituted for the crystal 23 of Fig. 2 and when it is so substituted, the condenser 24 shown in Fig. 2 may be omitted because the circuit will act as a resistor and the bridge 17 may be properly adjusted by adjustment of the resistor 22.

Although tubes 19 and 42 have been illustrated as triodes in separate envelopes, it is obvious that they may be included in the same envelope and tubes having a different number of electrodes may be used in place of the triodes.

It will also be understood by those skilled in the art that non-linear impedances may be included in more than one arm of the amplitude determining bridge networks of the embodiments of the oscillation generator of my invention. For example, resistor 32 shown in Fig. 2 may be replaced by the resistor whose value increases with current therethrough or the resistor 31 shown in Fig. 3 may be replaced by a resistor whose value decreases with increases of current therethrough in order to obtain a greater control of the amplitude of the oscillation voltage.

Having thus described my invention with particular reference to the preferred form thereof, and having shown and described certain modifications, it will be obvious to those skilled in the art to which the invention pertains, after understanding my invention, that various changes and other modifications may be made therein without departing from the spirit and scope of my invention, as defined by the claims appended hereto.

What is claimed as new and desired to be secured by Letters Patent of the United States is:

1. An oscillation generator comprising a pair of amplifiers each having inputs and outputs, a first bridge network interconnecting the output of one of said amplifiers with the input of the other of the said amplifiers and a second bridge network interconnecting the output of said other amplifier with the input of said one amplifier, one of said bridge networks having a frequency determining impedance in one arm thereof, and the other of said bridge networks having a non-linear impedance in one arm thereof.

2. An oscillation generator for operation at a predetermined frequency comprising a first bridge network substantially balanced in phase at said frequency, said bridge having a frequency determining impedance in one arm thereof, a second bridge network approximately balanced during operation of said generator, said second bridge having a non-linear impedance in one arm thereof, a pair of amplifiers each having inputs and outputs, and means connecting the input of one of said amplifiers and the output of the other of said amplifiers to conjugate points on said first bridge, and means connecting the output of said one amplifier and the input of said other amplifier to conjugate points on said second bridge.

3. An oscillation generator for operation at a predetermined frequency comprising a first bridge network substantially balanced in phase at said frequency, said bridge having a frequency determining impedance in one arm thereof, a balancing impedance in another arm thereof and non-reactive impedances in the remaining arms thereof, a second bridge network approximately balanced during operation of said generator, said second bridge having a non-linear impedance in one arm thereof, a balancing impedance in another arm thereof and non-reactive impedances in the remaining arms thereof, a first amplifier having an input and an output, said input being connected between a pair of diagonally opposite junction points between the arms of said first bridge and said output being connected between a pair of diagonally opposite junction points between the arms of said second bridge and a second amplifier having an input and an output, said last-mentioned input being connected between a second pair of diagonally opposite junction points between the arms of said second bridge and said last-mentioned output being connected between a second pair of diagonally opposite junction points between the arms of said first bridge.

4. An oscillation generator for operation at a predetermined frequency comprising a first bridge network substantially balanced in phase at said frequency, said bridge having a frequency determining impedance in one arm thereof, a balancing impedance in another arm thereof and only impedances presenting resistance at said frequency in the remaining arms thereof, a second bridge network approximately balanced during operation of said generator, said second bridge having a non-linear impedance in one arm thereof, a balancing impedance in another arm thereof and only impedances presenting resistance at said frequency in the remaining arms thereof, a first amplifier having an input and an output, said input being connected between a pair of diagonally opposite junction points between the arms of said first bridge and said output being connected between a pair of diagonally opposite junction points between the arms of said second bridge and a second amplifier having an input and an output, said last-mentioned input being connected between a second pair of diagonally opposite junction points between the arms of said second bridge and said last-mentioned output being connected between a second pair of diagonally opposite junction points between the arms of said first bridge.

5. An oscillation generator comprising a first bridge network having four series connected arms and including a resonant impedance connected in one arm of said bridge and an impedance which balances the impedance of said resonant impedance connected in a second arm of said bridge, a first amplifier having an input and an output, said output being connected between a pair of diagonally opposite junction points between the arms of said bridge, a second bridge network having four series connected arms and including a non-linear impedance in one arm of said second bridge, a second amplifier having an input and an output, said last-mentioned output being connected between a pair of diagonally opposite junction points between the arms of said second bridge, means connecting said input of said second amplifier to a further junction point between the arms of said first bridge and means connecting said input of said first amplifier to a further junction point between the arms of said second bridge.

6. An oscillation generator comprising a first bridge network having four series connected arms and including a piezoelectric crystal connected in one arm of said bridge and an impedance which balances the impedance of said crystal connected in a second arm of said bridge, a first amplifier having an input and an output, said output being connected between a pair of diagonally opposite junction points between the arms of said bridge, a second bridge network having four series connected arms and including a current variable resistance in one arm of said second bridge, a second amplifier having an input and an output, said last-mentioned output being connected between a pair of diagonally opposite junction points between the arms of said second bridge, means connecting said input of said second amplifier to a further junction point between the arms of said first bridge and means connecting said input of said first amplifier to a further junction point between the arms of said second bridge.

7. An oscillation generator comprising a first bridge network having four series connected arms and including a piezoelectric crystal connected in one arm of said bridge and an impedance which balances the reactance of said crystal and which approximately balances the resistance of said crystal connected in a second arm of said bridge, a first vacuum tube having output electrodes and a control electrode, one of said output electrodes being connected to the junction point between a pair of arms of said bridge and the other of said output electrodes being connected to a diagonally opposite junction point between another pair of arms of said bridge, a second bridge network having four series connected arms and including a current variable resistance in one arm of said second bridge, a second vacuum tube having output electrodes and a control electrode, one of said last-mentioned output electrodes being connected to the junction point between a pair of arms of said second bridge and the other of said last-mentioned output electrodes being connected to a diagonally opposite junction point between another pair of arms of said second bridge, means connecting said control electrode of said second tube to a further junction point between the arms of said first bridge and means connecting said control electrode of said first tube to a further junction point between the arms of said second bridge.

8. An oscillation generator comprising a first bridge network having four series connected arms and including a piezoelectric crystal connected in one arm of said bridge and an impedance which balances the reactance of said crystal and which approximately balances the resistance of said crystal connected in a second arm of said bridge, a first vacuum tube having an anode, a cathode and a grid, said anode being connected to the junction point between a pair of arms of said bridge and said cathode being connected to a diagonally opposite junction point between another pair of arms of said bridge, a source of energizing potential connected in series with said vacuum tube, a second bridge network having four series connected arms and including a current variable resistance in one arm of said second bridge, a second vacuum tube having an anode, a cathode and a grid, said last-mentioned anode being connected to the junction point between a pair of arms of said second bridge and said last-mentioned cathode being connected to a diagonally opposite junction point between another pair of arms of said second bridge, a source of energizing potential connected in series with said second vacuum tube, means connecting said grid of said second tube to a further junction point between the arms of said first bridge and means connecting said grid of said first tube to a further junction point between the arms of said second bridge.

9. An oscillation generator comprising a first bridge network having four series connected arms and including a piezoelectric crystal connected in one arm of said bridge and a resistor and a condenser connected in parallel in a second arm of said bridge adjacent to said one arm, a first vacuum tube having an anode, a cathode and a grid, said anode being connected to the junction point between said one arm and a third arm of said bridge and said cathode being connected to the junction point between said second arm and the fourth arm of said bridge, a source of energizing potential connected in series with said vacuum tube, a second bridge network having four series connected arms and including a current variable resistance connected in one arm of said second bridge, a second vacuum tube having an anode, a cathode and a grid, said last-mentioned anode being connected to the junction point between said one arm and a second arm of said second bridge and said last-mentioned cathode being connected to the junction point between the third and fourth arms of said second bridge, a source of energizing potential connected in series with said second vacuum tube, means connecting said grid of said second tube to the junction point between said one and said second arms of said first bridge and means connecting said grid of said first tube to the junction point between said one arm and an arm of said second bridge other than said second arm of said second bridge.

10. An oscillation generator comprising a first bridge network having four series connected arms and including impedances connected in first, second and third adjacent arms of said bridge, a piezoelectric crystal connected in the fourth arm of said bridge and a condenser connected in parallel with the impedance in said third arm of said bridge, a first vacuum tube having an anode, a cathode and a grid, said anode being connected to the junction point between said crystal and said first arm and said cathode being connected to the junction point between said third arm and said second arm, a source of energizing potential connected in series with said first and second arms and connected intermediate said first and second arms, a second bridge network havig four series connected arms and including impedances connected, respectively, in first, second and third arms of said second bridge, a current variable resistance whose resistance increases with temperature and a blocking condenser connected in series in the fourth arm of said second bridge, a second vacuum tube having an anode, a cathode and a grid, said last-mentioned anode being connected to the junction point between said fourth arm and said first arm of said second bridge and said last-mentioned cathode being connected to the junction point between said second and third arms of said second bridge, and a source of energizing potential connected in series with said first and second arms of said second bridge and connected intermediate said last-mentioned arms, means connecting said grid of said second tube to the junction point between the third and fourth arms of said first bridge and means connecting said grid of said first tube to the junction point between said third and fourth arms of said second bridge.

11. An oscillation generator comprising a first bridge network having four series connected arms and including resistors connected, respectively, in first, second and third adjacent arms of said bridge, a piezoelectric crystal connected in the fourth arm of said bridge and a condenser connected in parallel with the resistor in said third arm of said bridge, a first vacuum tube having an anode, a cathode and a grid, said anode being connected to the junction point between said crystal and said first arm and said cathode being connected to the junction point between said third arm and the said second arm, a source of energizing potential connected in series with said first and second arms and connected intermediate said first and second arms, a second bridge network having four series connected arms and including resistors connected, respectively, in first, second and third arms of said second bridge, a current variable resistance whose resistance increases with temperature and a blocking condenser connected in series in the fourth arm of said second bridge, a second vacuum tube having an anode, a cathode and a grid, said last-mentioned anode being connected to the junction point between said fourth arm and said first arm of said second bridge and said last-mentioned cathode being connected to the junction point between said second and third arms of said second bridge, and a source of energizing potential connected in series with said first and second arms of said second bridge and connected intermediate said last-mentioned arms, means connecting said grid of said second tube to the junction point between the third and fourth arms of said first bridge and means connecting said grid of said first tube to the junction point between said third and fourth arms of said second bridge.

12. An oscillation generator comprising a first approximately balanced bridge network having four series connected arms and including a pair of resistors connected in first and second adjacent arms of said bridge, a piezoelectric crystal connected in the fourth arm of said bridge and a resistor and a condenser connected in parallel and in the third arm of said bridge, a first vacuum tube having an anode, a cathode and a grid, said anode being connected to the junction point between said crystal and one of said pair of resistors and said cathode being connected to the junction point between said third arm and the other of said pair of resistors, a source of energizing potential connected in series with said first and second arms and connected intermediate said first and second arms, a second approximately balanced bridge network having four series connected arms and including three resistors connected, respectively, in first, second and third arms of said second bridge, a current variable resistance whose resistance increases with temperature and a blocking condenser connected in series in the fourth arm of said second bridge, a second vacuum tube having an anode, a cathode and a grid, said last-mentioned anode being connected to the junction point between said fourth arm and said first arm of said second bridge and said last-mentioned cathode being connected to the junction point between said second and third arms of said second bridge, and a source of energizing potential connected in series with said first and second arms of said second bridge and connected intermediate said last-mentioned arms, means connecting said grid of said second tube to the junction point between the third and fourth arms of said first bridge and means connecting said grid of said first tube to the junction point between said third and fourth arms of said second bridge.

13. An oscillation generator comprising a first bridge network having four series connected arms and including a pair of resistors connected in first and second adjacent arms of said bridge, a piezoelectric crystal connected in the fourth arm of said bridge and a resistor and a condenser connected in parallel and in the third arm of said bridge, a first vacuum tube having an anode, a cathode and a grid, said anode being connected to the junction point between said crystal and one of said pair of resistors and said cathode being connected to the junction point between said third arm and the other of said pair of resistors, a source of energizing potential connected in series with said first and second arms and connected intermediate said first and second arms, a second bridge network having four series connected arms and including three resistors connected, respectively, in first, second and third arms of said second bridge, a current variable resistance whose resistance increases with temperature and a blocking condenser connected in series in the fourth arm of said second bridge, a second vacuum tube having an anode, a cathode and a grid, said last-mentioned anode being connected to the junction point between said fourth arm and said first arm of said second bridge and said last-mentioned cathode being connected to the junction point between said second and third arms of said second bridge, and a source of energizing potential connected in series with said first and second arms of said second bridge and connected intermediate said last-mentioned arms, means connecting said grid of said second tube to the junction point between the third and fourth arms of said first bridge and means connecting said grid of said first tube to the junction point between said third and fourth arms of said second bridge, said arms of said bridges having impedances so chosen as to approximately balance said bridges during operation of said generator.

14. An oscillation generator comprising a first bridge network having four series connected arms and including a pair of resistors connected in first and second adjacent arms of said bridge, a piezoelectric crystal connected in the fourth arm of said bridge and a resistor and a condenser connected in parallel and in the third arm of said bridge, a first vacuum tube having an anode, a cathode and a grid, said anode being connected to the junction point between said crystal and one of said pair of resistors and said cathode being connected to the junction point between said third arm and the other of said pair of resistors, a source of energizing potential connected in series with said first and second arms and connected intermediate said first and second arms, a second bridge network having four series connected arms and including three resistors connected, respectively, in first, second and third arms of said second bridge, a current variable resistance whose resistance increases with temperature and a blocking condenser connected in series in the fourth arm of said second bridge, a second vacuum tube having an anode, a cathode and a grid, said last-mentioned anode being connected to the junction point between said fourth arm and said first arm of said second bridge and said last-mentioned cathode being connected to the junction point between said second and third arms of said second bridge, and a source of energizing potential connected in series with said first and second arms of said second bridge and connected intermediate said last-mentioned arms, means connecting said grid of said second tube to the junction point between the third and fourth arms of said first bridge and means connecting said grid of said first tube to the junction point between said third and fourth arms of said second bridge, the ratio of the values of said pair of resistors in said first bridge times the value of said resistor in said third arm of said first bridge being slightly greater than the value of the equivalent series resonance resistance of said crystal, the value of such condenser in said third arm of said first bridge being substantially equal to the value of the equivalent capacitance of said crystal divided by the ratio of the values of said pair of resistors in said first bridge and the value of said resistor in said third arm of said second bridge times the ratio of the value of said resistor in said first arm of said second bridge to the value of said resistor in said second arm of said second bridge being slightly greater than the value of current variable resistance without energization.

15. An oscillation generator comprising a first bridge network having four series connected arms and including a pair of resistors connected in first and second adjacent arms of said bridge, a piezoelectric crystal connected in the fourth arm of said bridge and a resistor and a condenser connected in parallel and in the third arm of said bridge, a first vacuum tube having an anode, a cathode and a grid, said anode being connected to the junction point between said crystal and one of said pair of resistors and said cathode being connected to the junction point between said third arm and the other of said pair of resistors, a source of energizing potential connected in series with said first and second arms and connected intermediate said first and second arms, a second bridge network having four series connected arms and including three resistors connected, respectively, in the first, second and third arms of said second bridge, a current variable resistance whose resistance increases with temperature and a blocking condenser connected in series in the fourth arm of said second bridge, a second vacuum tube having an anode, a cathode and a grid, said last-mentioned anode being connected to the junction point between said fourth arm and said first arm of said second bridge and said last-mentioned cathode being connected to the junction point between said second and third arms of said second bridge, and a source of energizing potential connected in series with said first and second arms of said second bridge and connected intermediate said last-mentioned arms, means connecting said grid of said second tube to the junction point between the third and fourth arms of said first bridge and means connecting said grid of said first tube to the junction point between said third and fourth arms of said second bridge, the values of said resistors, said condenser in said first bridge and said current variable resistance being determined by the following equations:

$$R_5 \times R_1 = K_1 \times R_2 \times R_e$$
$$R_7 \times R_3 = K_2 \times R_b \times R_4$$
$$C_1 \times R_2 = C_e \times R_1$$

where $R_5$ represents the value of the resistor in said third arm of said first bridge,
$R_1$ represents the value of the resistor connected to said fourth arm of said first bridge,
$R_2$ represents the value of the resistor connected to said third arm of said first bridge,
$R_7$ represents the value of the resistor in said third arm of said second bridge,
$R_3$ represents the value of the resistor in said first arm of said second bridge,
$R_4$ represents the value of the resistor in said second arm of said second bridge,
$R_e$ represents the value of the equivalent resistance of said crystal when operated at series resonance,
$R_b$ represents the value of the resistance of said current variable resistance during operation,
$C_1$ represents the value of the condenser in the third arm of said first bridge,
$C_e$ represents the value of the equivalent shunt capacitance of said crystal and its holder, and
$K_1$ and $K_2$ are constants having values slightly smaller than unity.

16. An oscillation generator comprising a first bridge network having four series connected arms and including a piezoelectric crystal connected in shunt with an inductance in one arm of said bridge, a first vacuum tube having an anode, a cathode and a grid, said anode being connected to the junction point between said one arm and a third arm of said bridge and said cathode being connected to the junction point between a second arm and the fourth arm of said bridge, a source of energizing potential connected in series with said vacuum tube, a second bridge network having four series connected arms and including a current variable resistance connected in one arm of said second bridge, a second vacuum tube having an anode, a cathode and a grid, said last-mentioned anode being connected to the junction point between said one arm and a second arm of said second bridge and said last-mentioned cathode being connected to the junction point between the third and fourth arms of said second bridge, a source of energizing potential connected in series with said second vacuum tube, means connecting said grid of said second tube to the junction point between said one and said second arms of said first bridge and means connecting said grid of said first tube to the junction point between said one arm and an arm of said second bridge other than said second arm of said second bridge.

17. An oscillation generator comprising a first bridge network having four series connected arms and including impedances connected in first, second and third adjacent arms of said bridge, and a piezoelectric crystal connected in shunt with a series connected inductance and a blocking condenser in the fourth arm of said bridge, a first vacuum tube having an anode, a cathode and a grid, said anode being connected to the junction point between said crystal and said first arm and said cathode being connected to the junction point between said third arm and said second arm, a source of energizing potential connected in series with said first and second arms and connected intermediate said first and second arms, a second bridge network having four series connected arms and including impedances connected, respectively, in first, second and third arms of said second bridge, and a current variable resistance whose resistance increases with temperature and a blocking condenser connected in series in the fourth arm of said second bridge, a second vacuum tube having an anode, a cathode and a grid, said last-mentioned anode being connected to the junction point between said fourth arm and said first arm of said second bridge and said last-mentioned cathode being connected to the junction point between said second and third arms of said second bridge, and a source of energizing potential connected in series with said first and second arms of said second bridge and connected intermediate said last-mentioned arms, means connecting said grid of said second tube to the junction point between the third and fourth arms of said first bridge and means connecting said grid of said first tube to the junction point between said third and fourth arms of said second bridge.

18. An oscillation generator comprising a first bridge network having four series connected arms and including resistors connected, respectively, in first, second and third adjacent arms of said bridge, and a piezoelectric crystal connected in shunt with a series connected inductance and a blocking condenser in the fourth arm of said bridge, a first vacuum tube having an anode, a cathode and a grid, said anode being connected to the junction point between said crystal and said first arm and said cathode being connected to the junction point between said third arm and the said second arm, a source of energizing potential connected in series with said first and second arms and connected intermediate said first and second arms, a second bridge network having four series connected arms and including resistors connected, respectively, in first, second and third arms of said second bridge, and a current variable resistance whose resistance increases with temperature and a blocking condenser connected in series in the fourth arm of said second bridge, a second vacuum tube having an anode, a cathode and a grid, said last-mentioned anode being connected to the junction point between said fourth arm and said first arm of said second bridge and said last-mentioned cathode being connected to the junction point between said second and third arms of said second bridge, and a source of energizing potential connected in series with said first and second arms of said second bridge and connected intermediate said last-mentioned arms, means connecting said grid of said second tube to the junction point between the third and fourth arms of said first bridge and means connecting said grid of said first tube to the junction point between said third and fourth arms of said second bridge.

References Cited in the file of this patent

UNITED STATES PATENTS

| Number | Name | Date |
|---|---|---|
| 2,163,403 | Meacham | June 20, 1939 |
| 2,258,128 | Black | Oct. 7, 1941 |
| 2,559,662 | Rheingold | July 10, 1951 |
| 2,565,922 | Howard | Aug. 28, 1951 |
| 2,611,873 | Gager | Sept. 23, 1952 |